(12) United States Patent
Song et al.

(10) Patent No.: US 8,858,859 B2
(45) Date of Patent: Oct. 14, 2014

(54) APPARATUS AND METHOD OF FABRICATING FLAT PANEL DISPLAY DEVICE

(75) Inventors: Tae-Joon Song, Gyeonggi-do (KR); Dhang Kwon, Gyeonggi-do (KR); Hang-Sup Cho, Gyeonggi-do (KR); Seong-Pil Cho, Geyonggi-do (KR); Ho Su Kim, Gyeonggi-do (KR); Doo-Hee Jang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 201 days.

(21) Appl. No.: 13/087,519

(22) Filed: Apr. 15, 2011

(65) Prior Publication Data

US 2011/0266709 A1 Nov. 3, 2011

(30) Foreign Application Priority Data

Apr. 30, 2010 (KR) ........................ 10-2010-0040645

(51) Int. Cl.
*B28B 11/08* (2006.01)
*B82Y 40/00* (2011.01)
*G03F 7/00* (2006.01)
*B82Y 10/00* (2011.01)

(52) U.S. Cl.
CPC ............... *G03F 7/0002* (2013.01); *B82Y 40/00* (2013.01); *B82Y 10/00* (2013.01)
USPC ............ 264/293; 425/385; 156/707; 156/758

(58) Field of Classification Search
CPC ....... B65H 3/08; B65H 3/0808; B65H 3/0816
USPC ........... 264/293, 334–335; 425/385; 156/344, 156/707, 758
See application file for complete search history.

(56) References Cited

U.S. PATENT DOCUMENTS

| 5,083,764 | A | 1/1992 | Chambers |
| 5,156,863 | A * | 10/1992 | Pricone et al. ................ 425/363 |
| 5,645,274 | A | 7/1997 | Ubayashi et al. |
| 2007/0062396 | A1 | 3/2007 | Takai et al. |
| 2008/0122144 | A1 | 5/2008 | Zhang et al. |
| 2009/0166930 | A1 * | 7/2009 | Fujita et al. ................... 264/334 |

FOREIGN PATENT DOCUMENTS

| CN | 1784728 A | 6/2006 |
| CN | 101681094 A | 3/2010 |
| JP | H04-250443 A | 9/1992 |

(Continued)

OTHER PUBLICATIONS

Dict.org definition of Adjacent.*
Dict.org definition of Adjacent. Downloaded in Sep. 2013.*

(Continued)

*Primary Examiner* — Amjad Abraham
(74) *Attorney, Agent, or Firm* — Morgan, Lewis & Bockius LLP

(57) ABSTRACT

Disclosed are an apparatus and method for fabricating a flat panel display device to realize easy separation of a substrate from an imprinting mold. The apparatus includes an imprinting mold connected to a substrate to form a thin film pattern on the substrate, a first adsorption pad to vacuum-adsorb the center of the imprinting mold, a second adsorption pad to vacuum-adsorb the periphery of the imprinting mold, and a connector connected to vacuum pins to vertically move in different regions of the first and second adsorption pads.

4 Claims, 4 Drawing Sheets

(56) References Cited

FOREIGN PATENT DOCUMENTS

| JP | 08198467 A | * | 8/1996 | ............... | B65H 3/08 |
| JP | 08333038 A | * | 12/1996 | ............... | B65H 3/08 |
| TW | 200738401 | | 10/2007 | | |
| TW | I362308 B | | 4/2012 | | |

OTHER PUBLICATIONS

SIPO—Office Action for Chinese Patent Application No. 2011-10084767.3—Including English Translation of the First Office Action—Issued on May 13, 2013.

Office Action dated Jan. 29, 2014, issued by the Taiwanese Patent Office for Taiwanese Patent Application No. 100109968.

* cited by examiner

APPARATUS AND METHOD OF FABRICATING FLAT PANEL DISPLAY DEVICE

This application claims the benefit of Korean Patent Application No. 10-2010-0040645, filed on Apr. 30, 2010, which is hereby incorporated by reference as if fully set forth herein.

BACKGROUND OF THE INVENTION

1. Field of the Invention

The present invention relates to an apparatus and method for fabricating a flat panel display device to realize easy separation of an imprinting mold from a substrate.

2. Discussion of the Related Art

Recently, a great deal of research has focused upon formation of thin films of flat panel display devices using a patterning process employing an imprinting mold.

The patterning process is performed according to the following procedure. First, a liquid resin is applied onto a substrate, and an imprinting mold having a groove and a protrusion comes into contact with the imprinting resin. As a result, the groove and protrusion of the imprinting mold are reversely transcribed to the imprinting resin. The reversely transcribed imprinting resin is cured to form a desired thin film pattern on the substrate.

After the thin film pattern is formed, a process for separating the imprinting mold from the substrate is required. For the separation, conventionally, the imprinting mold was formed so as to be larger than the substrate. In this case, as the area of the substrate increases, the size of the imprinting mold increases, thus making supply of the imprinting mold difficult. In addition, as the area of the substrate increases, the gap required to separate the imprinting mold from the substrate increases, thus causing breakage of the imprinting mold. In order to solve this problem, the imprinting mold and the substrate were formed so as to have the same size. In this case, the size of the imprinting mold is decreased, but high mechanical force to separate the imprinting mold from the substrate is disadvantageously required.

SUMMARY OF THE INVENTION

Accordingly, the present invention is directed to an apparatus and method for fabricating a flat panel display device that substantially obviate one or more problems due to limitations and disadvantages of the related art.

It is one object of the present invention to provide an apparatus and method for fabricating a flat panel display device to realize easy separation of a substrate from an imprinting mold.

To achieve this object and other advantages and in accordance with the purpose of the invention, as embodied and broadly described herein, provided is an apparatus for fabricating a flat panel display device including: an imprinting mold connected to a substrate to form a thin film pattern on the substrate; a first adsorption pad to vacuum-adsorb the center of the imprinting mold; a second adsorption pad to vacuum-adsorb the periphery of the imprinting mold; and a connector connected to vacuum pins to vertically move in different regions of the first and second adsorption pads.

The connector may be formed in the center of the first adsorption pad.

The connector may be formed in the periphery of the second adsorption pad such that it is adjacent to the edge of the imprinting mold.

The first and second adsorption pads may take the shape of a circle or polygon.

In accordance with another aspect of the present invention, provided is a method for fabricating a flat panel display device including: joining an imprinting mold having a protrusion and a groove to a substrate to form a thin film pattern on the substrate; and separating the imprinting mold from the substrate using a first adsorption pad to vacuum-adsorb the center of the imprinting mold, a second adsorption pad to vacuum-adsorb the periphery of the imprinting mold, and A connector connected to vacuum pins to vertically move in different regions of the first and second adsorption pads.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Hereinafter, the present invention will be described with reference to the annexed drawings.

Figure 1:
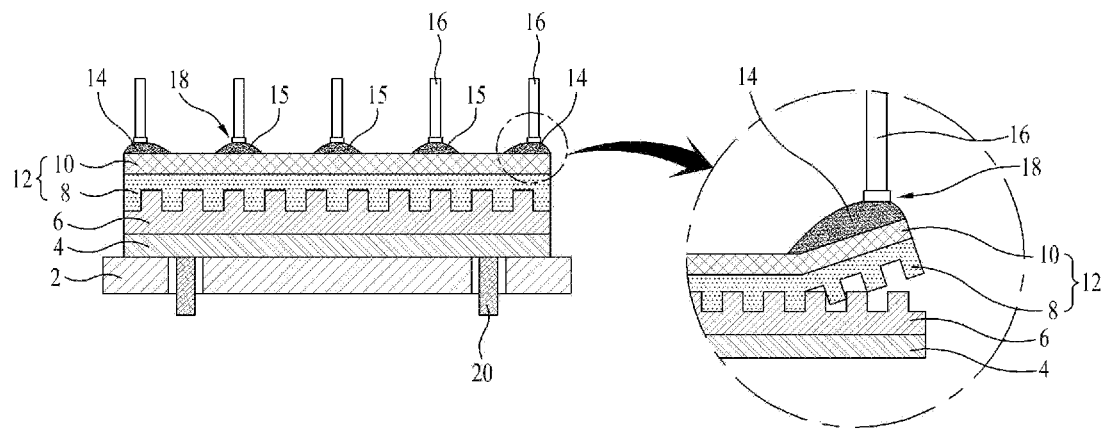
FIG. 1 is a sectional view illustrating an imprinting device according to one embodiment of the present invention.

FIG. 1 is a sectional view illustrating an imprinting device according to one embodiment of the present invention.

Referring to FIG. 1, the imprinting device according to one embodiment of the present invention includes a stage 2, on which a substrate 4, on which a thin film pattern 6 is formed, is mounted, an imprinting mold 12 to form the thin film pattern 6, a plurality of adsorption pads 14 and 15 to vacuum-adsorb the imprinting mold 12, and a plurality of vertically movable vacuum pins 16, coupled to respective adsorption pads 14 and 15.

The stage 2 adsorbs and fixes the substrate 4 through the vacuum line 20. A thin film pattern 6, which is pressed by the imprinting mold 12, comes into contact with the imprinting mold and is thus patterned, is formed on the substrate 4. The thin film pattern 6 is formed such that it is reversely transcribed with a groove and a protrusion of the imprinting mold 12.

The imprinting mold 12 includes a mold portion 8 provided with a groove and a protrusion to form the thin film pattern 6 and a back plane 10 to support the mold portion 8.

A plurality of vacuum pins 16 connect adsorption pads 14 and 15 and vertically move. At this time, when the vacuum pins 16 vertically move downward, the imprinting mold 12 is joined to the substrate 4, and when the vacuum pins 16 vertically move upward, the imprinting mold 12 is separated from the substrate 4.

The plurality of adsorption pads 14 and 15 adsorb the imprinting mold 12 under vacuum to join the imprinting mold 12 to the substrate 4 or separate the imprinting mold 12 from the substrate 4. The adsorption pads 14 and 15 take the shape of a circle or polygon and are made of rubber.

The adsorption pads 14 and 15 includes a plurality of first adsorption pads 15 to vacuum-adsorb the center of the imprinting mold 12 and a plurality of second adsorption pads 14 to vacuum-adsorb the periphery of the imprinting mold 12.

A connector 18 is formed in the center of the first adsorption pad 15 and the first adsorption pad 15 is connected to the vacuum pin 16 through the connector 18. Accordingly, an application point of the force to vertically elevate the first adsorption pad 15, when the imprinting mold is separated from the substrate 4, is arranged in the center of the first adsorption pad 15 corresponding to the connector 18.

Figure 2:
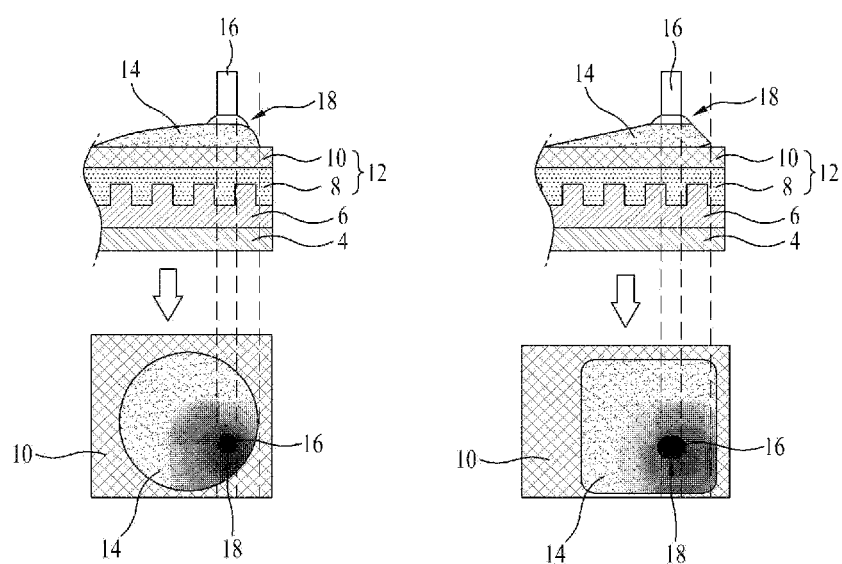
FIG. 2 is a plan view and a sectional view illustrating the second adsorption pad of FIG. 1.

The second adsorption pad 14, as shown in FIG. 2, is connected to the vacuum pin 16 through the connector 18. At this time, the connector 18 of the second adsorption pad 14 is formed in the periphery of the second adsorption pad 14. Specifically, the connector 18 of the second adsorption pad 14 is formed in the periphery of the second adsorption pad 14 such that it comes into contact with the outer edge of the imprinting mold 12. Accordingly, an application force of the force to vertically elevate the second adsorption pad 14, when the imprinting mold 12 is separated from the substrate 4, is arranged in the periphery of the second adsorption pad 14 adjacent to the outer edge of the imprinting mold 12. The second adsorption pad 14 can separate the imprinting mold 12 from the substrate 4, by a lower force, as compared to when the connector 18 is arranged in the center of the second adsorption pad 14.

The method for forming a thin film pattern using an imprinting device will be described in detail.

Figure 3A:
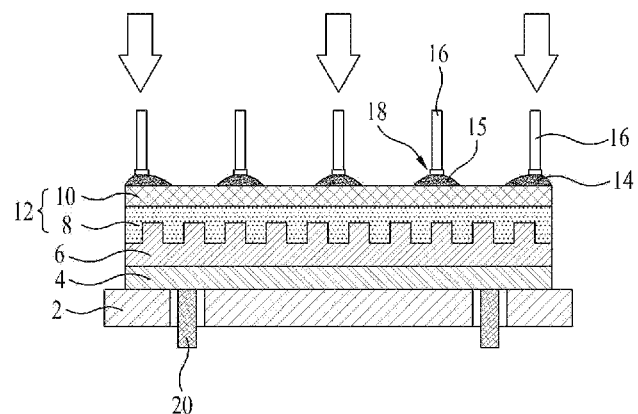
FIGS. 3A to 3C are sectional views illustrating the method for forming a thin film pattern using the imprinting device shown in FIGS. 1 and 2.
Figure 3B:
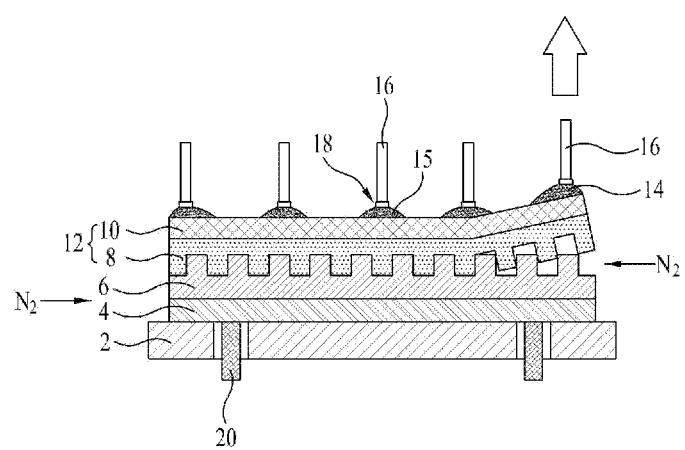
Figure 3C:
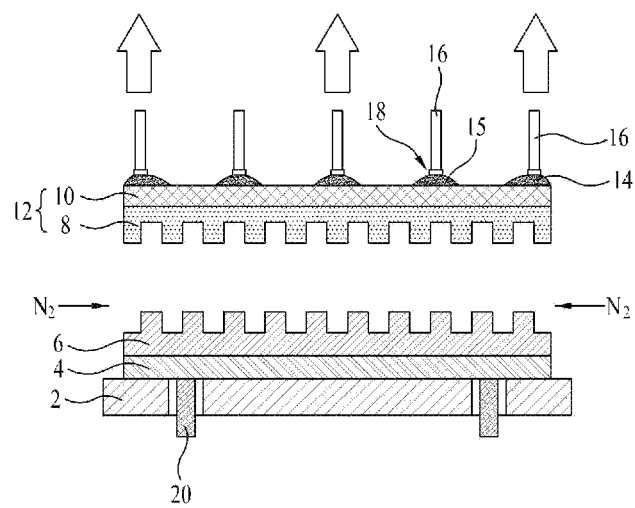

FIGS. 3A to 3C are sectional views illustrating the method for forming a thin film pattern using the imprinting device shown in FIGS. 1 and 2.

First, an imprinting resin is applied to a substrate 4 by spin coating or spinless coating. The substrate 4, to which the imprinting resin is applied, as shown in FIG. 3A, is adsorbed/fixed on the stage 2 through the vacuum line 20. In addition, an imprinting mold 12 including a groove and a protrusion is adsorbed/fixed on the stage 2 through a plurality of adsorption pads 14 and 15 and a plurality of vacuum pins 16. The imprinting mold 12 is joined to the imprinting resin by vertically moving the vacuum pins 16 downward and is cured by heat or light. Accordingly, the solvent in the imprinting resin is absorbed to the surface of the imprinting mold 12, and the imprinting resin moves in the groove in the imprinting mold 12 and a thin film pattern 6 is thus formed on the substrate 4. The thin film pattern 6 is reversely transcribed with the groove of the imprinting mold 12.

Then, as shown in FIGS. 3B and 3C, after the thin film pattern 6 is formed, the adsorption pads 14 and 15 and vacuum pins 16 are sequentially vertically elevated from one side to the other side of the imprinting mold 12. More specifically, the vacuum pins 16 connected to the second adsorption pads 14 arranged at one side of the imprinting mold 12 are first vertically elevated. As a result, one side of the imprinting mold 12 is separated from the one side of the substrate 4. At this time, the connector 18 is formed on the periphery of the second adsorption pad 14 adjacent to one side edge of the imprinting mold 12. As a result, an application point of the force to vertically elevate the second adsorption pad 14 is arranged in the periphery of the second adsorption pad 14 adjacent to one side edge of imprinting mold 12. Accordingly, the second adsorption pad can separate the substrate 4 from the imprinting mold 12 using less force than when the connector 18 is arranged in the center of the second adsorption pad 14.

After the one side of the imprinting mold 12 is separated from the substrate 4, vacuum pins 16 connected to the first adsorption pads 15 are sequentially vertically elevated from one side to the other side.

In addition, the vacuum pins 16 connected to the second adsorption pads 14 arranged at the other side of the imprinting mold 12 are vertically elevated. Accordingly, the imprinting mold 12 is separated from the substrate 4 from one side to the other side.

Meanwhile, in order to enable easy separation of the imprinting mold 12 from the substrate 4, $N_2$ gas is injected into the side of the imprinting mold 12 joined to the substrate 4.

Figure 4:
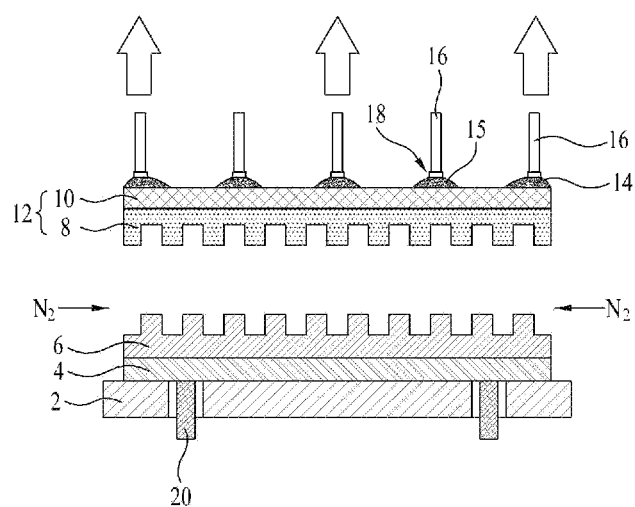
FIG. 4 is a sectional view illustrating a process for separating the imprinting mold from the substrate according to another embodiment.

Meanwhile, although the imprinting mold 12 is separated from the substrate 4 from one side to the other side as shown in FIGS. 3B and 3C, after the thin film pattern 6 is formed, the imprinting mold 12 may be separated from the substrate 4 from both sides to the center, as shown in FIG. 4.

Figure 5:
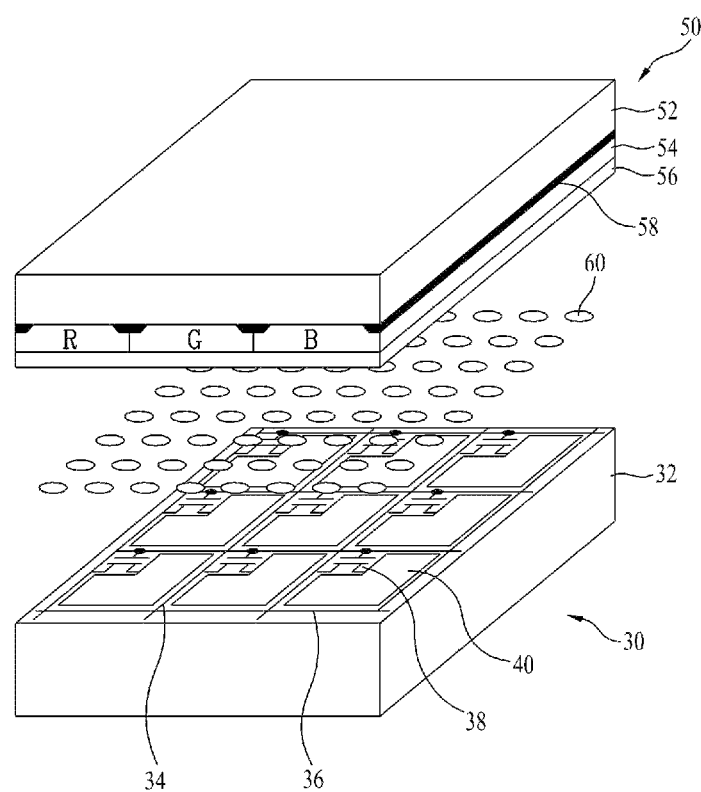
FIG. 5 is a perspective view illustrating a liquid crystal display panel including a thin film pattern shown in FIGS. 3A to 3C.

Meanwhile, the thin film pattern 6 provided with the imprinting mold 12 according to the present invention is applied to the liquid crystal display panel shown in FIG. 5. Specifically, the liquid crystal display panel shown in FIG. 5 includes a thin film transistor substrate 30 and a color filter substrate 50 which cross each other and are joined together such that the liquid crystal layer 60 is interposed therebetween.

The color filter substrate 50 includes a black matrix 58 to prevent light leakage from an upper substrate 52, a color filter 54 to realize color, a common electrode 56 to form an electric field with a pixel electrode, an overcoat layer to realize planarization, a column spacer formed on the overcoat layer to maintain a cell gap, and an upper alignment film (not shown) to cover the same.

The thin film transistor substrate 30 includes a plurality of gate lines 36 and a plurality of data lines 34 which cross each other on a lower substrate 32, a thin film transistor 38 adjacent to each intersection between the gate lines 36 and the data lines 34, a pixel electrode 40 formed at a pixel region defined by the intersection and a lower alignment film (not shown) to cover the same.

The color filter 54, black matrix 58, column spacer 54, thin film transistor 38, gate lines 36, data lines 34 and pixel electrode 40 of the liquid crystal display panel may be formed by a patterning process using the imprinting mold having a groove corresponding to the each pattern.

As apparent from the afore-going, for an apparatus and method for fabricating the flat panel display device, a plurality of first adsorption pads 15 to vacuum-adsorb the center of the imprinting mold 12 and a plurality of second adsorption pads 14 to vacuum-adsorb the periphery of the imprinting mold 12 are provided.

At this time, the connector 18 through which the second adsorption pad 14 is connected to the vacuum pin 16 is formed in the periphery of the second adsorption pad 14 such that it is adjacent to the outer periphery of the imprinting mold 12. Accordingly, an application point of the force to vertically elevate the second adsorption pad 14, when the imprinting mold 12 is separated from the substrate 4, is arranged in the outer periphery of the second adsorption pad adjacent to the outer periphery of imprinting mold 12. Accordingly, the second adsorption pad 14 can separate the imprinting mold 12 from the substrate 4, by a lower force, as compared to when the connector 18 is arranged in the center of the second adsorption pad 14. At this time, when the force applied to separate the imprinting mold 12 from the substrate 4 is decreased, breakage of the imprinting mold 12 can be prevented.

In addition, although the size of adsorption pads 14 and 15 is increased in order to improve adhesion force, the connector 18 of the adsorption pads 14 and 15 is moved and an application point of the force to separate the imprinting mold 12 from the substrate 4 is thus still adjacent to the outer periphery of the imprinting mold 12.

In addition, the time required to separate the imprinting mold 12 from the substrate 4 is decreased, thus reducing overall process time and improving production efficiency.

The apparatus and method for fabricating the flat panel display device include a plurality of first adsorption pads to vacuum-adsorb the center of the imprinting mold and a plurality of second adsorption pads to vacuum-adsorb the periphery of the imprinting mold.

At this time, the connector, through which the second adsorption pad is connected to the vacuum pin, is formed in the periphery of the second adsorption pad adjacent to the outer periphery of the imprinting mold. Accordingly, an application point of the force to vertically elevate the second adsorption pad, when the imprinting mold is separated from the substrate, is arranged in the outer periphery of the second adsorption pad adjacent to the outer periphery of the imprinting mold. Accordingly, the second adsorption pad can separate the imprinting mold from the substrate using less force than when the connector is arranged in the center of the second adsorption pad. At this time, when the force applied to separate the imprinting mold from the substrate is decreased, breakage of the imprinting mold can be reduced.

In addition, although the size of adsorption pads increases in order to improve adhesion force, the connector of the adsorption pad is moved and an application point of the force to separate the imprinting mold from the substrate is thus still adjacent to the outer periphery of the imprinting mold.

In addition, time required to separate the printing mold from the substrate is decreased, thus reducing overall process time and improving production efficiency.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. An apparatus for fabricating a flat panel display device, comprising:
   an imprinting mold connected to a substrate to form a thin film pattern on the substrate;
   first adsorption pads configured to vacuum-adsorb the first region of the imprinting mold, for separating the imprinting mold from the substrate;
   second adsorption pads configured to vacuum-adsorb the second region including a periphery of the imprinting mold, for separating the imprinting mold from the substrate;
   first vacuum pins each connected to each of the first adsorption pads through a first connector; and
   second vacuum pins each connected to each of the second adsorption pads through a second connector,
   wherein the first and second vacuum pins are vertically moved to separate the imprinting mold vacuum-adsorbed on the first and second adsorption pads from the substrate,
   wherein the first connector is formed on the center of an upper surface of the first adsorption pads,
   wherein the second connector is formed on the periphery of the upper surface of the second adsorption pad off-center toward an outer edge of the imprinting mold away from the first connector, such that an application point of a force to vertically elevate the second adsorption pad is arranged off-center in the periphery of the second adsorption pad, and
   wherein a thickness of the second adsorption pad at an area of the second connector and the second vacuum pins is larger than the thickness of the rest of the second adsorption pad, such that a thickest portion of the second adsorption pad is off-center of the second adsorption pad and is adjacent to the outer edge of the imprinting mold.

2. The apparatus according to claim 1, wherein the first and second adsorption pads take the shape of a circle or polygon.

3. A method for fabricating a flat panel display device, the method comprising:
   joining an imprinting mold having a protrusion and a groove to a substrate to form a thin film pattern on the substrate; and
   separating the imprinting mold from the substrate using:
      first adsorption pad to vacuum-adsorb the center of the imprinting mold;
      second adsorption pads to vacuum-adsorb the second region including periphery of the imprinting mold;
      first vacuum pins each connected to each of the first adsorption pads through a first connector; and
      second vacuum pins each connected to each of the second adsorption pads through a second connector,
   wherein the first and second vacuum pins are vertically moved to separate the imprinting mold vacuum-adsorbed on the first and second adsorption pads from the substrate,
   wherein the first connector is coupled to the center of an upper surface of the first adsorption pads,
   wherein the second connector is coupled to the periphery of the upper surface of the second adsorption pad off-center toward an outer edge of the imprinting mold away from the first connector, such that an application point of a force to vertically elevate the second adsorption pad is arranged off-center in the periphery of the second adsorption pad, and
   wherein a thickness of the second adsorption pad at an area of the second connector and the second vacuum pins is larger than the thickness of the rest of the second adsorption pad, such that a thickest portion of the second adsorption pad is off-center of the second adsorption pad and is adjacent to the outer edge of the imprinting mold.

4. The method according to claim 3, wherein the first and second adsorption pads take the shape of a circle or polygon.

* * * * *